United States Patent
Arai et al.

(10) Patent No.: US 12,365,837 B2
(45) Date of Patent: Jul. 22, 2025

(54) WAVELENGTH CONVERSION MEMBER

(71) Applicants: TAMURA CORPORATION, Tokyo (JP); NATIONAL INSTITUTE FOR MATERIALS SCIENCE, Ibaraki (JP)

(72) Inventors: Yusuke Arai, Tokyo (JP); Hiroyuki Sawano, Tokyo (JP); Daisuke Inomata, Tokyo (JP); Yoshihiro Yamashita, Tokyo (JP); Rikiya Suzuki, Saitama (JP); Kiyoshi Shimamura, Ibaraki (JP); Encarnacion Antonia Garcia Villora, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 828 days.

(21) Appl. No.: 17/633,787

(22) PCT Filed: Aug. 7, 2020

(86) PCT No.: PCT/JP2020/030388
§ 371 (c)(1),
(2) Date: Feb. 8, 2022

(87) PCT Pub. No.: WO2021/029364
PCT Pub. Date: Feb. 18, 2021

(65) Prior Publication Data
US 2022/0282151 A1    Sep. 8, 2022

(30) Foreign Application Priority Data
Aug. 9, 2019 (JP) .................................. 2019-148217

(51) Int. Cl.
*C09K 11/77* (2006.01)
*C01F 17/34* (2020.01)
(Continued)

(52) U.S. Cl.
CPC .......... *C09K 11/7774* (2013.01); *C01F 17/34* (2020.01); *C30B 29/28* (2013.01);
(Continued)

(58) Field of Classification Search
CPC ..... C09K 11/7774; C01F 17/34; C30B 29/28; F21S 41/176; F21V 9/30; C01P 2002/54;
(Continued)

(56) References Cited

U.S. PATENT DOCUMENTS 8,680,547 B2    3/2014  Schmidt et al.
8,829,779 B2    9/2014  Schmidt et al.
(Continued)

FOREIGN PATENT DOCUMENTS

CN    101821357 A    9/2010
JP    2011-500880 A   1/2011
(Continued)

OTHER PUBLICATIONS

Translation of the International Preliminary Report on Patentability and Written Opinion dated Feb. 17, 2022 issued In PCT/JP2020/030388.
(Continued)

*Primary Examiner* — Anita Nassiri-Motlagh
(74) *Attorney, Agent, or Firm* — Scully, Scott, Murphy & Presser, PC

(57) ABSTRACT

A wavelength conversion member includes a sintered body of a phosphor. An average diameter of pores in an arbitrary cross section falls within a range of not less than 0.28 μm and not more than 0.98 μm. A ratio of an area of pores to a whole area in an arbitrary cross section falls within a range of not less than 0.04% and not more than 2.7%. An average diameter of grains of the phosphor in an arbitrary cross section falls within a range of not less than 1 μm and not more than 3 μm.

5 Claims, 15 Drawing Sheets

(51) Int. Cl.
*C30B 29/28* (2006.01)
*F21S 41/176* (2018.01)
*F21V 9/30* (2018.01)
*G03B 21/20* (2006.01)

(52) U.S. Cl.
CPC ...... *C01P 2002/54* (2013.01); *C01P 2002/60* (2013.01); *C01P 2004/02* (2013.01); *C01P 2004/03* (2013.01); *C01P 2006/17* (2013.01); *F21S 41/176* (2018.01); *F21V 9/30* (2018.02); *G03B 21/204* (2013.01)

(58) Field of Classification Search
CPC .............. C01P 2002/60; C01P 2004/02; C01P 2004/03; C01P 2006/17; G03B 21/204
USPC .................................................. 252/301.4 R
See application file for complete search history.

(56) References Cited

U.S. PATENT DOCUMENTS

| | | | |
|---|---|---|---|
| 8,883,055 | B2 | 11/2014 | Kelso et al. |
| 9,868,270 | B2 | 1/2018 | Irie |
| 10,442,987 | B2 | 10/2019 | Takasone et al. |
| 10,947,448 | B2 | 3/2021 | Yanagihara et al. |
| 10,975,497 | B2 | 4/2021 | Uwani et al. |
| 11,001,755 | B2 | 5/2021 | Harada et al. |
| 11,214,731 | B2 | 1/2022 | Ito et al. |
| 2009/0066221 | A1 | 3/2009 | Schmidt et al. |
| 2010/0208449 | A1 | 8/2010 | Schmidt et al. |
| 2012/0326344 | A1 | 12/2012 | Kelso et al. |
| 2015/0247618 | A1 | 9/2015 | Irie |
| 2016/0240748 | A1 | 8/2016 | Inomata et al. |
| 2018/0244986 | A1 | 8/2018 | Yanagihara et al. |
| 2019/0062627 | A1 | 2/2019 | Takasone et al. |
| 2019/0153315 | A1 | 5/2019 | Harada et al. |
| 2020/0200347 | A1 | 6/2020 | Jwani et al. |
| 2020/0220052 | A1 | 7/2020 | Inomata et al. |
| 2020/0392401 | A1 | 12/2020 | Ito et al. |
| 2021/0179932 | A1 | 6/2021 | Yanagihara et al. |

FOREIGN PATENT DOCUMENTS

| | | |
|---|---|---|
| JP | 5049336 B2 | 10/2012 |
| JP | 2013-518172 A | 5/2013 |
| JP | 2015-081314 A | 4/2015 |
| JP | 2016-138034 A | 8/2016 |
| JP | 2017-120864 A | 7/2017 |
| JP | 6164221 B2 | 7/2017 |
| JP | 2018-107298 A | 7/2018 |
| JP | 2018-141035 A | 9/2018 |
| JP | 2018-172628 A | 11/2018 |
| JP | 6473495 A | 2/2019 |
| JP | 2019-045844 A | 3/2019 |
| JP | 2019-108242 A | 7/2019 |
| WO | 2018/021418 A1 | 2/2018 |

OTHER PUBLICATIONS

International Search Report dated Sep. 8, 2020 issued in PCT/JP2020/030388.
Japanese Office Action dated Oct. 5, 2021 issued in JP 2019-148217.
Official Action dated Feb. 8, 2023 received from the China National Intellectual Property Administration in related application CN 202080056642.7 together with English language translation.
Japanese Office Action dated Mar. 15, 2022 from related JP2019-148217 together with English language translation.

WAVELENGTH CONVERSION MEMBER

CROSS-REFERENCE TO RELATED APPLICATION

The present patent application claims the priority of Japanese patent application No. 2019-148217 filed on Aug. 9, 2019, and the entire contents of Japanese patent application No. 2019-148217 are hereby incorporated by reference.

TECHNICAL FIELD

The present invention relates to a wavelength conversion member.

BACKGROUND ART

A plate-shaped wavelength conversion member formed of a single crystal phosphor, or a polycrystalline phosphor having a porosity of not more than 0.5%, is known as a wavelength conversion member that absorbs excitation light and emits light with a different wavelength (see, e.g., Patent Literature 1).

According to Patent Literature 1, by using a single crystal phosphor not containing pores or a polycrystalline phosphor with a low porosity as a wavelength conversion member, it is possible to suppress a decrease in thermal conductivity of the wavelength conversion member that is caused by the presence of pores containing air having low thermal conductivity. In addition, since the pores are not contained or the porosity is low, backscatter of the applied excitation light is almost eliminated and excitation is efficiently performed.

Also, a wavelength conversion member formed of a ceramic material is known, in which a density of the ceramic material is not less than 97% and diameters of pores are 250-2900 nm (see, e.g., Patent Literature 2). In this regard, the porosity cannot be estimated to be not more than 3% even though the density of the ceramic material is not less than 97% and even if a portion of the wavelength conversion member other than the material is assumed to consist of pores. This is because mixing of impurities with different densities and unintended formation of different phases exist as parameters affecting the material density and may cause an increase or a decrease in the material density.

According to Patent Literature 2, the wavelength conversion member has a high translucence due to high density. In addition, the diameter of pores needs to be 250-2900 nm to obtain high luminous efficiency.

CITATION LIST

Patent Literatures

Patent Literature 1: JP 6,164,221 B
Patent Literature 2: JP 5,049,336 B

SUMMARY OF INVENTION

Technical Problem

However, light is not scattered inside the wavelength conversion member formed of a single crystal phosphor described in Patent Literature 1 since this wavelength conversion member does not have grain boundaries therein and also does not contain pores. In addition, light is hardly scattered inside the wavelength conversion member formed of a polycrystalline phosphor described in Patent Literature 1 since the porosity of this wavelength conversion member is low. Thus, excitation light and fluorescence spread over a wide area inside the wavelength conversion member and are extracted from a wide are of a light extraction surface. As a result, light cannot be focused efficiently by a lens, hence, low coupling efficiency with an optical system.

Patent Literature 2 discloses the diameter of the pores as described above. However, a light extraction area on the light extraction surface of the wavelength conversion member is not determined only by the diameter of the pores. Therefore, Patent Literature 2 does not disclose a configuration to suppress expansion of the light extraction area on the light extraction surface of the wavelength conversion member.

It is an object of the invention to provide a wavelength conversion member in which expansion of a light extraction area on a light extraction surface is suppressed.

Solution to Problem

One aspect of the invention provides a wavelength conversion member in (1) to (6) below.

(1) A wavelength conversion member, comprising a sintered body of a phosphor,
wherein an average diameter of pores in an arbitrary cross section falls within a range of not less than 0.28 µm and not more than 0.98 µm,
wherein a ratio of an area of pores to the whole area in an arbitrary cross section falls within a range of not less than 0.04% and not more than 2.7%, and
wherein an average diameter of grains of the phosphor in an arbitrary cross section falls within a range of not less than 1 µm and not more than 3 µm.

(2) The wavelength conversion member according to (1), wherein the average diameter of pores in an arbitrary cross section falls within a range of not less than 0.28 µm and not more than 0.68 µm, and wherein the ratio of the area of pores to the whole area in an arbitrary cross section falls within a range of not less than 0.04% and not more than 0.7%.

(3) The wavelength conversion member according to (1) or (2), wherein the phosphor has a composition represented by a composition formula $(Y_{1-x-y-z}Lu_xGd_yCe_z)_{3+a}Al_{5-a}O_{12}$ ($0 \leq x \leq 0.9994$, $0 \leq y \leq 0.0669$, $0.0002 \leq z \leq 0.0067$, $-0.016 \leq a \leq 0.315$).

(4) The wavelength conversion member according to (1) or (2), wherein each of the grains of the phosphor comprises a single crystal.

(5) The wavelength conversion member according to (3), wherein each of the grains of the phosphor comprises a single crystal.

(6) The wavelength conversion member according to (3), wherein each of the grains of the phosphor comprises a single crystal, and wherein a value of a ratio of internal quantum efficiency at 300° C. to internal quantum efficiency at 25° C. when a peak wavelength of excitation light is 450 nm is not less than 0.93.

Advantageous Effects of Invention

According to an aspect of the invention, it is possible to provide a wavelength conversion member in which expansion of a light extraction area on a light extraction surface is suppressed.

DESCRIPTION OF EMBODIMENTS

Figure 1A:
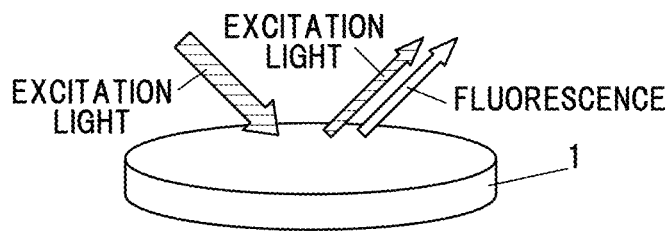
FIG. 1A is a perspective view showing a wavelength conversion member in the first embodiment.

First Embodiment (Configuration of a Wavelength Conversion Member)

FIGS. 1A to 1D are perspective views showing a wavelength conversion member 1 in the first embodiment. The wavelength conversion member 1 is formed of a sintered body of a phosphor and has a specific shape.

The wavelength conversion member 1 is composed of plural phosphor grains and thus has grain boundaries therein, and also has pores between the grains. The grain boundaries and the pores scatter light and are thus important to suppress spreading of light extracted from the wavelength conversion member 1 and to improve efficiency of coupling the wavelength conversion member 1 to an optical system. In this regard, the grains are particles in the sintered body and are each visually recognizable as a region enclosed by a closed curve as a contour in an arbitrary cross section of the wavelength conversion member 1.

In the wavelength conversion member 1, the grains of the phosphor are bonded to each other by sintering, and a binder or a sintering aid is not included. In general, e.g., a binder such as PVA (polyvinyl alcohol) has a lower thermal conductivity than phosphor. However, since the wavelength conversion member 1 does not include a binder, there is no risk of a decrease in heat dissipation due to use of the binder.

The wavelength conversion member 1 is configured such that an average diameter of pores in an arbitrary cross section falls within a range of not less than 0.28 μm and not more than 0.98 μm, a ratio of the area of pores to the whole area in an arbitrary cross section falls within a range of not less than 0.04% and not more than 2.7%, and an average diameter of grains of the phosphor in an arbitrary cross section falls within a range of not less than 1 μm and not more than 3 μm.

In the wavelength conversion member 1, pores are present at portions where four or more grains are in contact with each other, and such pores contribute to scattering of light. (Although pores cannot be seen at many grain boundary portions in, e.g., the surface optical microscope images shown in FIG. 9, this is because some pores are not visible at some portions in the thickness direction but the pores exist actually.) Meanwhile, in case of a material composed of different materials, if a refractive index changes at boundaries between the grains, i.e., at grain boundaries, this also contributes to scattering of light. In this way, the diameter and ratio of the pores and the grain diameter determine how much light in the wavelength conversion member 1 is scattered and how much light spreads inside the wavelength conversion member 1.

Then, inside the wavelength conversion member 1, spreading of excitation light which entered the wavelength conversion member 1, and spreading of fluorescence emitted from the phosphor which absorbed the excitation light, are suppressed when the average diameter of the pores in an arbitrary cross section of the wavelength conversion member 1, the ratio of the area of the pores to the whole area in an arbitrary cross section and the average diameter of the grains of the phosphor in an arbitrary cross section satisfy the above-mentioned conditions. As a result, expansion of a light extraction area on the light extraction surface is suppressed and coupling efficiency with the optical system is enhanced.

To more effectively suppress spreading of light inside the wavelength conversion member 1, it is more preferable that the average diameter of the pores in an arbitrary cross section of the wavelength conversion member 1 fall within a range of not less than 0.28 μm and not more than 0.68 μm, and the ratio of the area of the pores to the whole area in an arbitrary cross section fall within a range of not less than 0.04% and not more than 0.7%.

Here, a diameter of pore in a cross section means a length of the longest portion of each pore in the cross section. In this regard, the diameter of pore in a cross section is a diameter of a cross section of a pore appearing in the cross section and is a parameter that is different from a three-dimensionally measured pore diameter. Meanwhile, a diameter of grain of the phosphor means a length of the longest portion of each grain in the cross section. Then, the ratio of the area of pores to the whole area means a value in percent obtained by dividing the total area of all pores in the cross section by the whole area of the cross section including the pores.

The diameter of grains of the phosphor and the diameter of the pores in the wavelength conversion member 1 depend on a particle diameter of a particle group of the phosphor before sintering (hereinafter, referred to as "raw material powder"). When using raw material powder with a small particle diameter and also using a method in which sintering is performed for a short time, such as the SPS (Spark Plasma Sintering) method, it is possible to suppress growth of grains of the phosphor and also to reduce the pore diameter.

To manufacture the wavelength conversion member 1 in which, e.g., the average diameter of grains of the phosphor in an arbitrary cross section falls within the range of not less than 1 μm and not more than 3 μm and the average diameter of plural pores in the an arbitrary cross section falls within the range of not less than 0.28 μm and not more than 0.98 μm, raw material powder with a median diameter of not less than 0.6 μm and not more than 5 μm is sintered. The median diameter here means a particle diameter at 50 vol % in cumulative distribution.

In manufacturing of the wavelength conversion member 1, the raw material powder needs to be finely crushed powder so that the average diameter and area ratio of pores in an arbitrary cross section can fall within the ranges described above. However, when the particle diameter of the raw material powder is smaller, a rate of a decrease in internal quantum efficiency with temperature rise tends to be larger.

As a result of intense study to solve this problem, the present inventors found that, when heat treatment on the material in the powder form under predetermined conditions (hereinafter, referred to as powder annealing) is performed before the sintering step, temperature characteristics equivalent to when using raw material powder with a large particle diameter are obtained. Thus, by using powder annealing when manufacturing the wavelength conversion member 1 formed of the sintered body of the phosphor, it is possible to effectively suppress a decrease in internal quantum efficiency with temperature rise. The details of powder annealing will be described later.

The diameter of plural pores in an arbitrary cross section of the wavelength conversion member 1 is distributed in a range of, e.g., not less than 0.12 μm and not more than 1.7 μm.

Meanwhile, the diameter of the grains of the phosphor in an arbitrary cross section of the wavelength conversion member 1 is distributed in a range of, e.g., not less than 0.3 μm and not more than 6.2 μm.

The average diameter, the diameter distribution range and the area ratio of pores in a cross section of the wavelength conversion member 1 described above can be measured by optical microscope observation or SEM (Scanning Electron Microscope) observation, etc. Also, the average diameter and the distribution range of the grains of the phosphor in the cross section of the wavelength conversion member 1 described above can be measured by optical microscope observation or SEM (Scanning Electron Microscope) observation, etc. Meanwhile, the median diameter of the raw material powder can be measured by a laser diffraction particle diameter distribution analyzer (e.g., Partica mini manufactured by HORIBA, Ltd.). In this regard, in pore measurement, it is not necessary to observe pores of not more than 0.1 μm at a SEM magnification of, e.g., more than 10000λ. Such pores are much smaller than the wavelength and do not have a light scattering effect. Therefore, the pores should be observed at a magnification of, e.g., 3000×.

The phosphor constituting the wavelength conversion member 1 is, e.g., a YAG-based phosphor having a composition represented by a composition formula $(Y_{1-x-y-z}Lu_xGd_yCe_z)_{3+a}Al_{5-a}O_{12}$ ($0 \leq x \leq 0.9994$, $0 \leq y \leq 0.0669$, $0.0002 \leq z \leq 0.0067$, $-0.016 \leq a \leq 0.315$). Lu and Gd are components that do not serve as luminescence centers substituting for Y. Ce is a component (an activator) that can serve as a luminescence center substituting for Y.

Some of atoms in the above phosphor composition may occupy different positions in the crystal structure. In addition, although the value of the composition ratio of O is 12 in the above composition formula, the above composition also includes a composition in which the value of the composition ratio of O deviates slightly from 12 due to unavoidably mixed oxygen or deficient oxygen. Meanwhile, the value of a in the composition formula is a value that changes inevitably during the production of the phosphor, but its change within the numerical range of about $-0.016 \leq a \leq 0.315$ hardly affects the physical properties of the phosphor.

The reason why the numerical value range of z representing a concentration of Ce in the above composition formula is $0.0002 \leq z \leq 0.0067$ is as follows. When the numerical value of z is smaller than 0.0002, the too low Ce concentration causes a problem that absorption of excitation light decreases, which result in that external quantum efficiency decreases too much. On the other hand, when larger than 0.0067, cracks or voids, etc., occur during growth of a single crystal phosphor ingot and cause an increase in probability of degradation in crystal quality. When the numerical value of z is not less than 0.0010, wavelength conversion can be sufficiently performed even if the wavelength conversion member 1 is thin, hence, it is possible to reduce cost and improve heat dissipation.

Each of the grains of the phosphor constituting the wavelength conversion member 1 is a single crystal when using single crystal raw material powder and is a polycrystal when using polycrystalline raw material powder.

Properties of the wavelength conversion member 1 are different depending on whether the raw material powder before sintering is a single crystal or a polycrystal. This is because while the single crystal raw material powder is a single-phase crystal which does not contain impurities or grain boundaries therein, the polycrystalline raw material powder may possibly contain impurities, grain boundaries or different phases in each particle. In general, a decrease in internal quantum efficiency with temperature rise is smaller in a single crystal phosphor than in a polycrystalline phosphor. Therefore, a wavelength conversion member made of the single crystal raw material powder exhibit a smaller decrease in internal quantum efficiency with temperature rise than a wavelength conversion member made of the polycrystalline raw material powder.

When the wavelength conversion member 1 formed of, e.g., a sintered body of a single crystal YAG-based phosphor is manufactured by a manufacturing process including powder annealing, the wavelength conversion member 1 has excellent temperature characteristics such that a value of a ratio of internal quantum efficiency at 300° C. to internal quantum efficiency at 25° C. when a peak wavelength of excitation light is 450 nm is not less than 0.93. Therefore, it can exhibit an excellent function as a wavelength conversion member used in a light-emitting device with extremely high brightness per unit area, such as laser projector or laser headlight in which excitation light is laser light.

The internal quantum efficiency of the wavelength conversion member 1 can be measured by a QE-2100 quantum efficiency measurement system manufactured by Otsuka Electronics Co., Ltd. In particular, the internal quantum efficiency is calculated by dividing the number of photons of fluorescence by the number of photons of excitation light (at a wavelength of 450 nm) absorbed by the phosphor.

The shape of the wavelength conversion member 1 is not specifically limited but is typically a flat plate shape. In the examples shown in FIGS. 1A to 1D, the wavelength conversion member 1 has a flat plate shape which is circular in plan view.

Figure 1B:
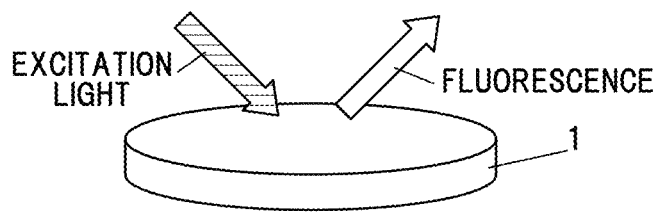
FIG. 1B is a perspective view showing the wavelength conversion member in the first embodiment.
Figure 1C:
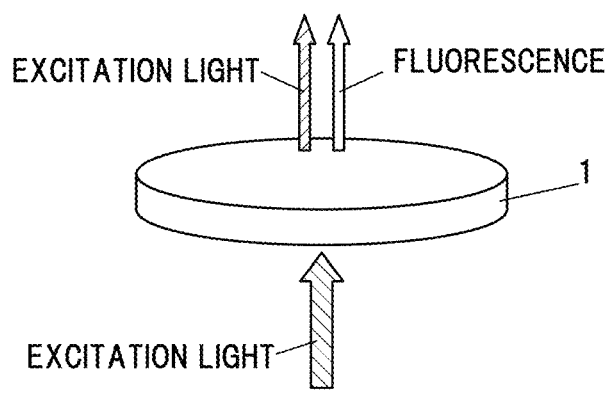
FIG. 1C is a perspective view showing the wavelength conversion member in the first embodiment.
Figure 1D:
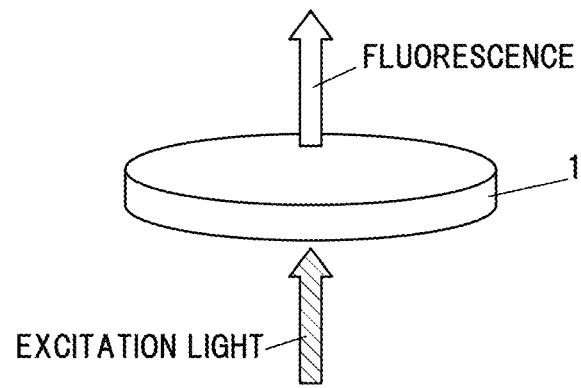
FIG. 1D is a perspective view showing the wavelength conversion member in the first embodiment.

FIG. 1A and FIG. 1C are schematic diagrams illustrating examples in which mixed light of a portion of excitation light and fluorescence produced by wavelength conversion of the excitation light is extracted from the wavelength conversion member 1. When, e.g., the excitation light is blue light and the fluorescence is yellow light, white light can be extracted from the wavelength conversion member 1. FIGS. 1B and 1D are schematic diagrams illustrating examples in which substantially all the excitation light is wavelength-converted and substantially only the fluorescence is extracted from the wavelength conversion member 1.

In the examples shown in FIGS. 1A and 1B, the wavelength conversion member 1 is used as a reflection type wavelength conversion member configured such that excitation light is reflected thereat and light is extracted. In the examples shown in FIGS. 1C and 1D, the wavelength conversion member 1 is used as a transmission type wavelength conversion member configured such that excitation light is transmitted therethrough and light is extracted.

Meanwhile, to improve heat dissipation, a thickness of the wavelength conversion member 1 is preferably not more than 0.3 mm. As a specific example, when a blue laser light of not less than 20 W is shone onto the wavelength conversion member 1 formed of a YAG-based single crystal phosphor with a spot diameter of not more than 3.0 mm in high-brightness lighting such as a projector and a spotlight, the thickness is preferably not more than 0.3 mm by taking into account thermal conductivity of the wavelength conversion member 1. When a blue laser light of not less than 2 W is shone onto the wavelength conversion member 1 formed of a YAG-based single crystal phosphor with a spot diameter of not more than 0.3 mm in headlight of vehicle or flashlight, the thickness is preferably not more than 0.3 mm by taking into account thermal conductivity of the wavelength conversion member 1. Meanwhile, to suppress cracks during processing, the thickness of the wavelength conversion member 1 is preferably not less than 0.05 mm.

(Manufacture of the Wavelength Conversion Member)

An example of a method for manufacturing the wavelength conversion member 1 will be described below.

Figure 2:
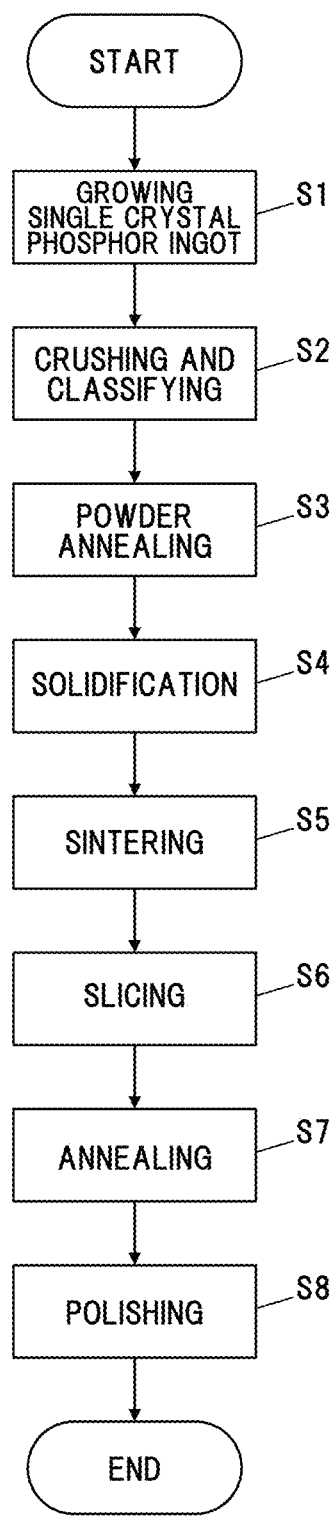
FIG. 2 is a flowchart showing an example of a process for manufacturing the wavelength conversion member in the first embodiment.

FIG. 2 is a flowchart showing an example of a process for manufacturing the wavelength conversion member 1 in the first embodiment. FIG. 2 shows a flow of a process of manufacturing the wavelength conversion member 1 formed of a sintered body of a YAG-based single crystal phosphor, as an example.

Firstly, a single crystal phosphor is grown into an ingot (Step S1). Powders of $Y_2O_3$, $Lu_2O_3$, $Gd_2O_3$, $CeO_2$ and $Al_2O_3$ with high purity (not less than 99.99%) are prepared as starting materials and are dry mixed, thereby obtaining a powder mixture. In this regard, the raw material powders of Y, Lu, Gd, Ce and Al are not limited to those listed above. In addition, the powder of $Lu_2O_3$ or $Gd_2O_3$ is not used when a single crystal phosphor not containing Lu or Gd is manufactured.

The ingot is grown by, e.g., a liquid phase growth method such as the CZ method (the Czochralski Method), the EFG method (the Edge Defined Film Fed Growth Method), the Bridgman method, the FZ method (the Floating Zone Method) or the Verneuil method.

Figure 3:
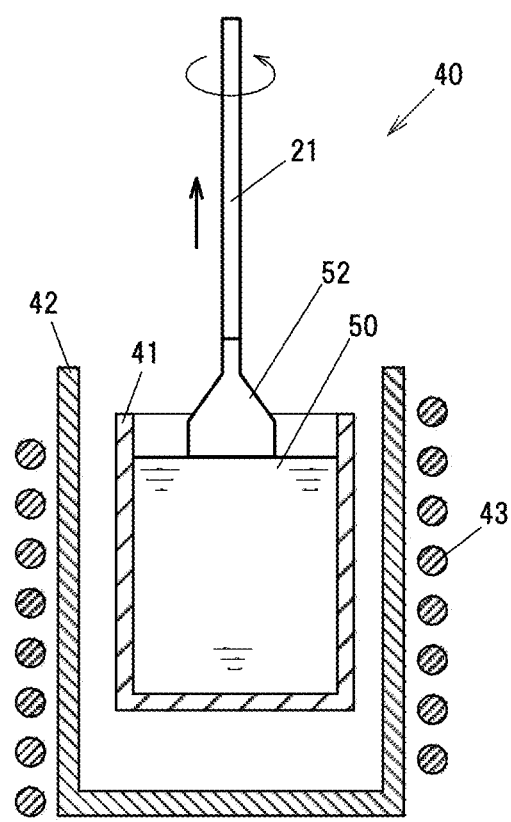
FIG. 3 is a schematic cross-sectional view showing pulling-up of a single crystal phosphor ingot by the CZ method.

FIG. 3 is a schematic cross-sectional view showing pulling-up of a single crystal phosphor ingot by the CZ method. A crystal growth apparatus 40 mainly includes an iridium crucible 41, a ceramic cylindrical container 42 housing the crucible 41, and a high-frequency coil 43 wound around the cylindrical container 42.

When the CZ method is used, the obtained powder mixture is loaded into the crucible 41, and a high-frequency energy of 30 kW is supplied to the crucible 41 by the high-frequency coil 43 in a nitrogen atmosphere to generate an induced current, and the crucible 41 is thereby heated. Thus, the powder mixture is melted and a melt 50 is then obtained.

Next, after a tip of a seed crystal 51, which is a YAG-based single crystal phosphor, is brought into contact with the melt 50, a single crystal phosphor ingot 52 is grown in a <111> direction at a pull-up temperature of not less than 1960° C. by pulling up at a pulling rate of not more than 1 mm/h while rotating at a rotation speed of 10 rpm. The single crystal phosphor ingot 52 is grown in a nitrogen atmosphere at atmospheric pressure while supplying nitrogen into the cylindrical container 42 at a flow rate of 2 L/min.

In this way, the single crystal phosphor ingot 52 having, e.g., a diameter of about 2.5 cm and a length of about 10 cm is obtained.

Next, the single crystal phosphor ingot is crushed and classified (Step S2). Firstly, the single crystal phosphor ingot is coarsely crushed by rapid heating and rapid cooling, thereby obtaining a single crystal phosphor particle group having a particle diameter of about 1-3 mm. The rapid heating can be performed using an oxyhydrogen gas burner, etc. The rapid cooling can be performed using water cooling.

Subsequently, the single crystal phosphor particle group is pulverized using a planetary ball mill and is then dried. By classifying it, raw material powder with a median diameter within a range of not less than 0.6 μm and not more than 5 μm is obtained. A particle diameter of the raw material powder can be controlled by, e.g., processing time of the pulverization process.

Next, powder annealing is performed on the raw material powder (Step S3). The powder annealing is performed in, e.g., an atmospheric air or an argon or nitrogen atmosphere at a temperature within a range of not less than 1200° C. and not more than 1750° C. for a period of time within a range of not less than 2 hours and not more than 15 hours. When powder annealing temperature is lower than 1200° C., a pronounced effect (an effect of suppressing a decrease in internal quantum efficiency with temperature rise) cannot be obtained. It is also desirable to be not more than 1750° C. since annealing at a temperature lower than the melting point of the material can prevent the material from sticking to an alumina container. It has also been found that the effect does not show any difference after powder annealing time exceeds 15 hours.

In case that the wavelength conversion member 1 formed of a sintered body of the YAG-based single crystal phosphor is manufactured and when the median diameter of the raw material powder is about not more than 5 μm, the ultimately obtained wavelength conversion member 1 exhibits a decrease in internal quantum efficiency under high temperature condition due to smallness of the particle diameter of the raw material powder. However, even when the median diameter of the raw material powder is about not more than 5 μm, the value of the ratio of internal quantum efficiency at 300° C. to internal quantum efficiency at 25° C. when the peak wavelength of the excitation light is 450 nm can be increased to not less than 0.93 by performing the powder annealing. Furthermore, when the median diameter of the raw material powder is not more than 3 μm, the effect of the powder annealing is more pronounced because the rate of the decrease in the internal quantum efficiency under high temperature condition is higher.

Next, the powder-annealed raw material powder is solidified by applying pressure (Step S4). The solidification method is not specifically limited and it is possible to use, e.g., the SPS (Spark Plasma Sintering) method, the HP (Hot Pressing) method, or CIP (Cold Isostatic Pressing) method, etc. Alternatively, solidification may be performed by sheet molding or a slip casting method. When these methods are used, an organic binder is required to hold the raw material powder on a wafer, but this organic binder can be removed during the process.

A magnitude of the pressure applied to the raw material powder during solidification is large enough for the raw material powder to maintain the solidified form and depends on the solidification method. When, e.g., the CIP method is used, it is preferably not less than 100 MPa.

Next, the solidified raw material powder of the single crystal phosphor is sintered (Step S5). The solidified raw material powder of the single crystal phosphor coheres together by performing sintering.

The sintering is preferably performed in an argon atmosphere. The present inventors have confirmed that an increase in internal quantum efficiency is greater when performing the sintering in an argon atmosphere than when performing in an atmospheric air, an oxygen atmosphere, a nitrogen atmosphere, or a mixed gas atmosphere of 97.5% Ar and 2.5% hydrogen.

Sintering temperature and hold time are appropriately set according to the sintering method. When sintering is performed in, e.g., a firing furnace, the sintering temperature is preferably within a range of not less than 1450° C. and not more than 1750° C. The hold time after reaching the target temperature is preferably within a range of not less than 1 hour and not more than 10 hours.

When the sintering temperature is lower than 1450° C., sintering takes a long time and also it is likely to be sintered unevenly. Meanwhile, when more than 1750° C., the phosphor may melt. In addition, when the sintering temperature is more than 1750° C., grain growth proceeds, resulting in that the average diameter of the grains of the phosphor may exceed 3 μm. When the hold time is shorter than 1 hour, sintering may be insufficient. Meanwhile, when longer than 10 hours, grain growth proceeds by excessive sintering, resulting in that uniformity of the particle diameter is lost.

When the SPS method is used for solidification in Step S4, sintering in Step S5 is also performed in a SPS device in a continuous manner. In particular, for example, heat treatment at 1450° C. to 1650° C. is performed on the raw material powder of the phosphor under applied pressure of not less than 10 MPa. When sintering is performed by the SPS method, firing time can be reduced, hence, grain growth is suppressed and it is easy to control the pore size.

When the pressure is lower than 10 MPa, sintering is less likely to proceed and pores increases. This causes problems that thermal conductivity of the wavelength conversion member 1 decreases or the excitation light is prevented from entering the wavelength conversion member 1. When heat treatment temperature is lower than 1450° C., it is likely to be sintered unevenly. Meanwhile, when more than 1650° C., there is a problem that a reaction rate becomes too fast and the sintered body melts since activity of the raw material powder of the single crystal phosphor with a small particle diameter with respect to the temperature is high. In addition, when the sintering temperature is more than 1650° C., grain growth proceeds, resulting in that the average diameter of the grains of the phosphor may exceed 3 μm.

At this time, as the temperature rises, a density of the raw material powder of the single crystal phosphor increases, causing displacement of a piston which is applying pressure to the raw material powder of the single crystal phosphor. After the temperature reaches the target temperature and a displacement amount of the piston becomes substantially zero, it is held for a predetermined time. This hold time is preferably, e.g., within a range of not less than 30 seconds and not more than 10 minutes for the sintered body with a size of φ20 mm and a thickness of 10 mm, and within a range of not less than 1 minute and not more than 30 minutes for a size of φ50 mm and a thickness of 30 mm. When shorter than 30 seconds, sintering may be insufficient. Meanwhile, when longer than 30 minutes, sintering proceeds excessively and uniformity of the particle diameter is lost.

As the method for sintering while applying pressure to the raw material powder of the single crystal phosphor, there are methods such as the HIP (Hot Iso-static Pressing) method, the HP (Hot Pressing) method and the VP (Vacuum Pressing) method in addition to the SPS method, and these methods may be used.

Next, the sintered body of the single crystal phosphor is sliced, thereby obtaining a wafer-shaped sintered body (Step S6). Slicing can be performed by using a multi-wire saw, etc.

If the thickness of the wafer-shaped sintered body is set to too small, cracks may occur at the time of slicing, causing a decrease in the yield. From this viewpoint, the thickness of the wafer-shaped sintered body is preferably not less than 0.15 mm. Meanwhile, if the thickness is set to too large, the number of pieces which can be cut out by slicing decreases, resulting in an increase in cost. From this viewpoint, the thickness of the wafer-shaped sintered body is preferably not more than 1.0 mm.

Next, annealing treatment is performed on the wafer-shaped sintered body of the single crystal phosphor (Step S7). Performing the annealing treatment can restore internal quantum efficiency of the sintered body of the single crystal phosphor which has slightly decreased due to sintering in the argon atmosphere by the SPS method in Step S5. In this regard, the annealing treatment can be omitted when the HP method, etc., is used for sintering in Step S5.

When the annealing treatment is performed at a too low temperature or for a too short time, quantum efficiency of the sintered body of the single crystal phosphor is not sufficiently improved. Meanwhile, when the annealing treatment is performed at a too high temperature, the load of the device increases. Furthermore, when performed at an extremely high temperature, the sintered body melts. Longer annealing treatment time is preferable from the viewpoint of increasing the quantum efficiency, but there is a problem that the cost increases when it is too long. Considering these problems, temperature of the annealing treatment is preferably within a range of not less than 1450° C. and not more than 1600° C. Annealing treatment time is preferably not less than 5 hours. The annealing treatment time is also preferably not more than 15 hours since the internal quantum efficiency of the sintered body of the single crystal phosphor hardly increases after the annealing treatment time exceeds 15 hours and the cost increases with an increase in the annealing treatment time.

In addition, the annealing treatment is preferably performed in the argon atmosphere. The present inventors have confirmed that the increase in internal quantum efficiency is greater when performing the annealing treatment in the argon atmosphere than when performing in an atmospheric air, an oxygen atmosphere, a nitrogen atmosphere, or a mixed gas atmosphere of 97.5% Ar and 2.5% hydrogen.

Next, polishing treatment is performed on the wafer-shaped sintered body of the single crystal phosphor (Step S8). The polishing treatment is performed by a combination of, e.g., grinding, diamond slurry polishing, CMP (Chemical Mechanical polishing), etc. The polishing treatment is performed until the thickness of the wavelength conversion member 1 reaches the intended thickness (preferably not less than 0.05 mm and not more than 0.3 mm).

The wafer-shaped wavelength conversion member 1 formed of the sintered body of the YAG-based single crystal phosphor is obtained through the above steps.

In case that the wavelength conversion member 1 formed of a sintered body of a polycrystalline phosphor is manufactured, the mixed raw materials are subjected to solid phase reaction and are then sintered by using the SPS method, etc., and the sintered body of the polycrystalline phosphor having a predetermined shape is thereby obtained. To manufacture a sintered body of, e.g., a YAG-based polycrystalline phosphor, powders of $Y_2O_3$, $Lu_2O_3$, $Gd_2O_3$, $Al_2O_3$ and $CeO_2$ as raw materials are mixed in amounts according to the garnet composition and are then subjected to solid-phase reaction.

Whether the phosphor is a single crystal or a polycrystal, it is required to appropriately set pressure, firing temperature and firing time in the sintering step in addition to the particle diameter of the raw material powder, so that the average diameter of the pores in an arbitrary cross section of the wavelength conversion member 1, the ratio of the area of the pores to the whole area in an arbitrary cross section and the average diameter of the grains of the phosphor in an arbitrary cross section can fall within the desired ranges.

The particle diameter of the raw material powder and the pressure, firing temperature and firing time in the sintering step when manufacturing the wavelength conversion member 1 formed of the sintered body of the single crystal phosphor described above can be also applied to manufacturing of the wavelength conversion member 1 formed of the sintered body of the polycrystalline phosphor.

For example, by using the raw material powder with a median diameter in the range of not less than 0.6 μm and not more than 5 μm and setting the pressure, firing temperature and firing time in the sintering step within the above-mentioned ranges, the average diameter of the pores in an arbitrary cross section of the wavelength conversion member 1 can fall within the range of not less than 0.28 μm and not more than 0.98 μm, the ratio of the area of the pores to the whole area in an arbitrary cross section can fall within the range of not less than 0.04% and not more than 2.7%, and the average diameter of the grains of the phosphor in an arbitrary cross section can fall within the range of not less than 1 μm and not more than 3 μm, whether the phosphor is a single crystal or a polycrystal.

When the wavelength conversion member 1 formed of a sintered body of a phosphor other than the YAG system is manufactured, treatment temperatures of powder annealing in Step S3, sintering in Step S5 and annealing in Step S7 can be appropriately set according to the melting point of the material. The upper limits and the lower limits of the treatment temperatures can be set based on the same reasons as for the YAG-based phosphor described above.

Second Embodiment (Configuration of a Wavelength Conversion Element)

Figure 4:
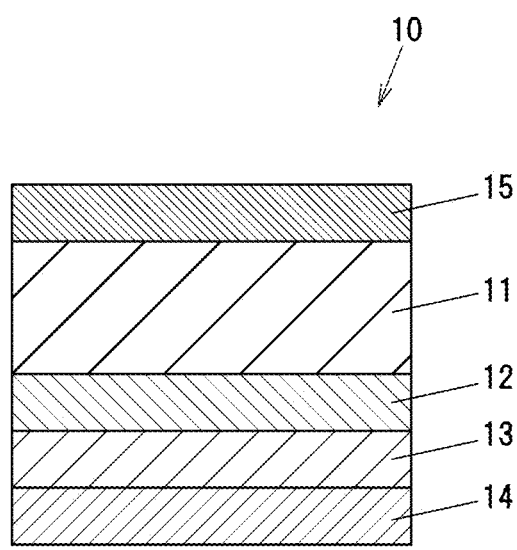
FIG. 4 is a vertical cross-sectional view showing a wavelength conversion element in the second embodiment.

FIG. 4 is a vertical cross-sectional view showing a wavelength conversion element 10 in the second embodiment. The wavelength conversion element 10 includes a wavelength conversion layer 11 composed of the wavelength conversion member 1 in the first embodiment, a reflective film 12 formed on a surface of the wavelength conversion layer 11 on a side opposite to the light extraction side (hereinafter, referred to as a back side), a protective film 13 formed on a surface of the reflective film 12 on the back side, a pad metal 14 formed on a surface of the protective film 13 on the back side, and an antireflective film 15 formed on a surface of the wavelength conversion layer 11 on the light extraction side.

The wavelength conversion layer 11 is composed of the wavelength conversion member 1. That is, the wavelength conversion layer 11 is configured such that an average diameter of pores in an arbitrary cross section falls within the range of not less than 0.28 μm and not more than 0.98 μm, a ratio of the area of pores to the whole area in an arbitrary cross section falls within the range of not less than 0.04% and not more than 2.7%, and an average diameter of grains of the phosphor in an arbitrary cross section falls within the range of not less than 1 μm and not more than 3 μm.

A thickness of the wavelength conversion layer 11 also preferably falls within the range of not less than 0.050 mm and not more than 0.3 mm, in the same manner as the wavelength conversion member 1.

The reflective film 12 is, e.g., a metal film formed of a highly reflective metal such as silver, silver alloy or aluminum, a multilayer dielectric film, or a combination thereof. The multilayer dielectric film is a multilayer stacked film composed of a high-refractive-index film (n=not less than 2.0) and a low-refractive-index film (n=not more than 1.5), where $TiO_2$, $ZrO_2$ and ZnO, etc., can be used as a material of the high-refractive-index film, and $SiO_2$, $CaF_2$ and $MgF_2$, etc., can be used as a material of the low-refractive-index film. The reflective film 12 preferably has a reflectance such that the average reflectance at the wavelength of the light from the wavelength conversion layer 11 side (e.g., 450-700 nm) is not less than 90%.

Since the diameter of the pores contained in the wavelength conversion layer 11 is small, irregularities on the surface of the wavelength conversion layer 11 are microscopic. Thus, adhesion between the wavelength conversion layer 11 and the reflective film 12 formed on the surface of the wavelength conversion layer 11 is high and step breakage is less likely to occur, hence, separation is suppressed. In addition, it is possible to further enhance adhesion between the wavelength conversion layer 11 and the reflective film 12 by forming the reflective film after the surface of the wavelength conversion layer 11 is planarized by grinding, diamond slurry polishing, CMP, etc.

The protective film 13 prevents a decrease in the reflectance of the reflective film 12 due to mixing of solder or the pad metal 14 into the reflective film 12 during solder mounting of the wavelength conversion element 10. When the reflective film 12 is formed of, e.g., a metal (e.g., silver, aluminum, or an alloy thereof), the protective film 13 is required to protect the reflective film 12. Particularly when silver is used to form the reflective film 12, it is necessary to cover the reflective film 12, including side surfaces, with the protection film 13 to prevent sulfurization phenomenon. A material of the protective film 13 is preferably oxides, nitrides or high-melting-point metals, etc., which are thermally stable, and in particular, it is possible to use $SiO_2$, SiN, TiN, AlN, TiW and Pt, etc. However, when the reflective film 12 is formed of a material less likely to be eroded by solder or the pad metal 14, such as a dielectric, the wavelength conversion element 10 does not need to include the protective film 13.

The pad metal 14 has a high wettability to solder, and has, e.g., a stacked film structure of Ti/Ni/Au or Ti/Pt/Au, etc., from the reflective film 12 side (from the protective film 13 side).

The antireflective film 15 can suppress reflection of the excitation light at the surface when the excitation light enters the wavelength conversion element 10. The antireflective film 15 is composed of a single layer film or a multilayer film of a dielectric which is transparent to visible light. Alternatively, reflection of the excitation light may be suppressed by providing irregularities on the surface of the wavelength conversion layer 11 on the light extraction side instead of providing the antireflective film 15. Furthermore, the antireflective film 15 may be further provided after irregularities are provided on the surface of the wavelength conversion layer 11 on the light extraction side.

(Manufacture of the Wavelength Conversion Element)

An example of a process for manufacturing the wavelength conversion element 10 will be described below. Firstly, the wavelength conversion layer 11 composed of the wavelength conversion member 1 in the first embodiment is prepared.

Next, the reflective film 12 is formed on the surface of the wavelength conversion layer 11 by a sputtering method or a vapor deposition method, etc. Before forming the reflective film 12, the surface of the wavelength conversion layer 11 on which the reflective film 12 is formed may be planarized as described above.

Next, the protective film 13 is formed so as to cover the surfaces of the reflective film 12.

Next, the pad metal 14 is formed on the protective film 13 by a sputtering method or a vapor deposition method, etc. Then, if needed, the antireflective film 15 may be formed on the surface of the wavelength conversion layer 11 on the light extraction side.

Next, singulation into individual wavelength conversion elements 10 is performed by blade dicing, etc.

Effects of the Embodiments

In the first embodiment described above, it is possible to provide the wavelength conversion member 1 in which expansion of the light extraction area on the light extraction surface is suppressed and which has excellent coupling efficiency with an optical system. In addition, in the second embodiment described above, it is possible to provide the wavelength conversion element 10 which includes the wavelength conversion layer 11 composed of such a wavelength conversion member 1, is excellent in temperature characteristics, suppresses spreading of light to be extracted, and has excellent coupling efficiency with an optical system.

Example 1

The wavelength conversion members 1 in the first embodiment described above were made and various evaluations were conducted. In this Example, four wavelength conversion members 1 were made as a sample A, a sample B, a sample C and a sample D.

The samples A to D are sintered bodies of a single crystal phosphor having a composition represented by a composition formula $(Y_{0.998}Ce_{0.002})_3Al_5O_{12}$, and were made by the manufacturing method including the powder annealing step and the sintering step using SPS method in the first embodiment.

Table 1 below shows the manufacturing conditions for the samples A to D and their densities (mass/volume)×100 after being manufactured. "Median diameter" in Table 1 is a median diameter of the raw material powder. "Pressure", "Maximum temperature", "Hold time" and "Atmosphere" are conditions for the sintering step using the SPS method (Step S5).

TABLE 1

|  | Median diameter [μm] | Density [%] | Pressure [MPa] | Maximum temperature [° C.] | Hold time [min] | Atmosphere |
| --- | --- | --- | --- | --- | --- | --- |
| Sample A | 1.1 | 93.3 | 80 | 1450 | 0.5 | Ar |
| Sample B | 1.1 | 99.3 | 80 | 1550 | 0.5 | Ar |
| Sample C | 1.1 | 97.6 | 50 | 1550 | 0.5 | Ar |
| Sample D | 1.1 | 99.1 | 80 | 1500 | 0.5 | Ar |

Figure 7A:
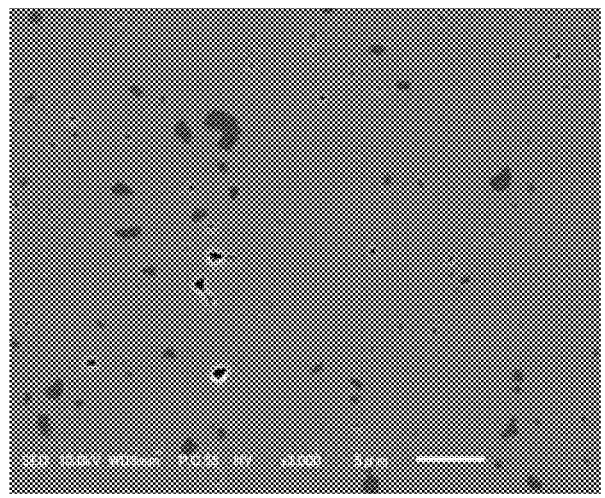
FIG. 7A is an SEM image showing a cross section of a sample B in Example.
Figure 7B:
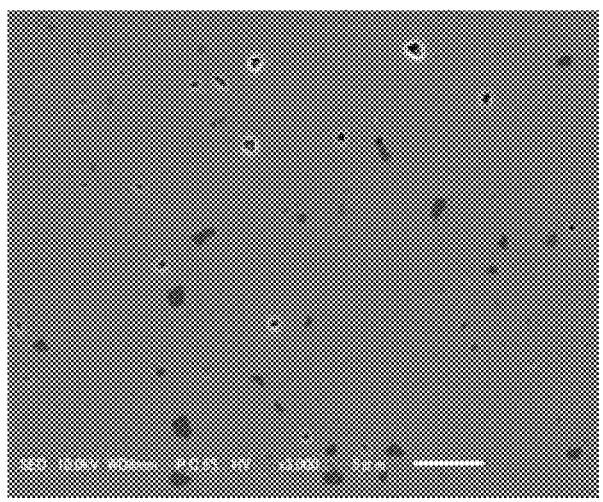
FIG. 7B is an SEM image showing a cross section of the sample B in Example.
Figure 7C:
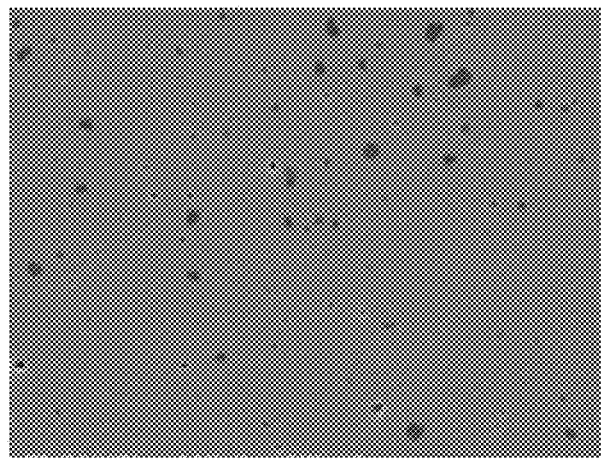
FIG. 7C is an SEM image showing a cross section of the sample B in Example.
Figure 8A:
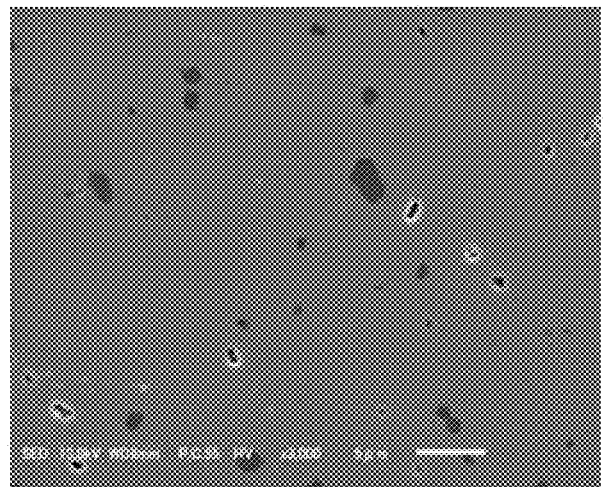
FIG. 8A is an SEM image showing a cross section of a sample C in Example.
Figure 8B:
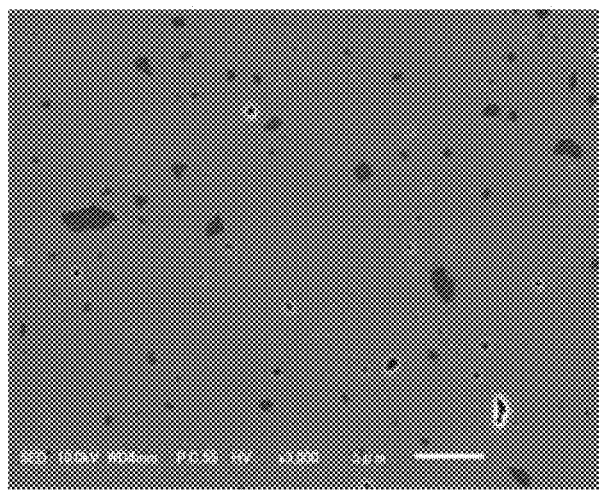
FIG. 8B is an SEM image showing a cross section of the sample C in Example.
Figure 8C:
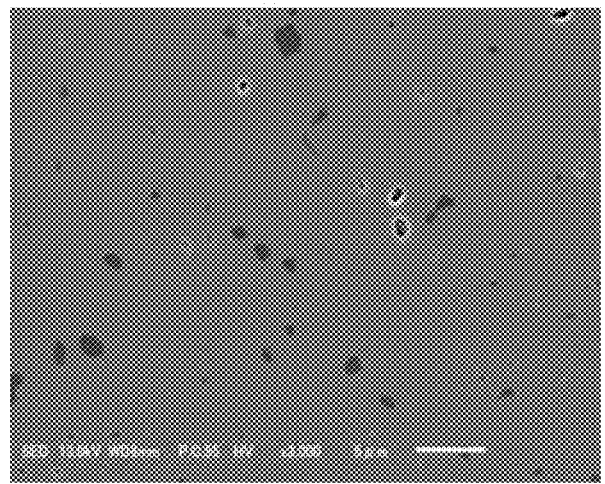
FIG. 8C is an SEM image showing a cross section of the sample C in Example.

FIGS. 5A to 5C and FIGS. 6A to 6C are SEM images showing cross sections of the sample A. FIGS. 7A to 7C are SEM images showing cross sections of the sample B. FIGS. 8A to 8C are SEM images showing cross sections of the sample C.

Figure 5A:
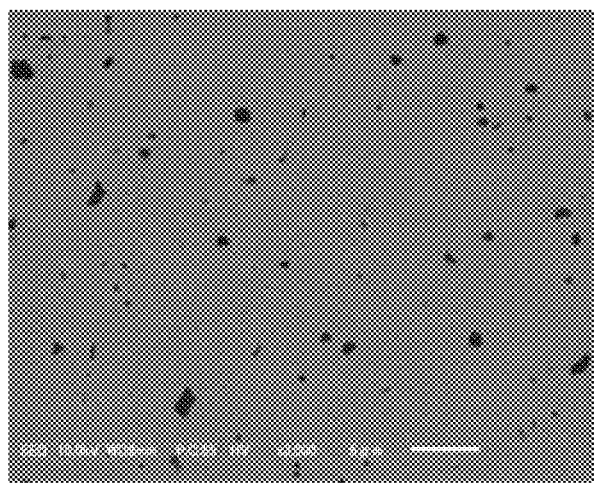
FIG. 5A is an SEM image showing a cross section of a sample A in Example.
Figure 5B:
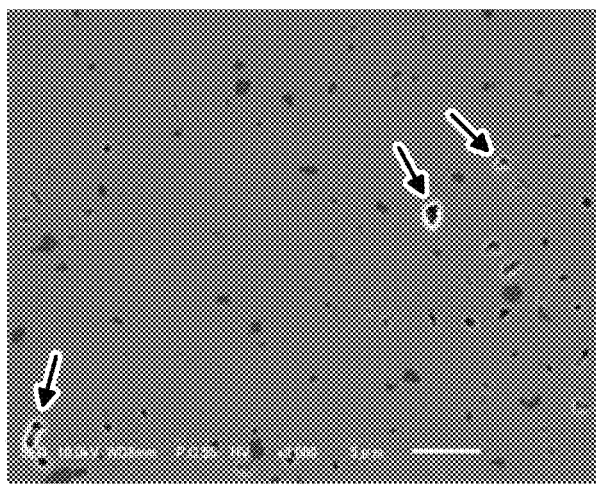
FIG. 5B is an SEM image showing a cross section of the sample A in Example.
Figure 5C:
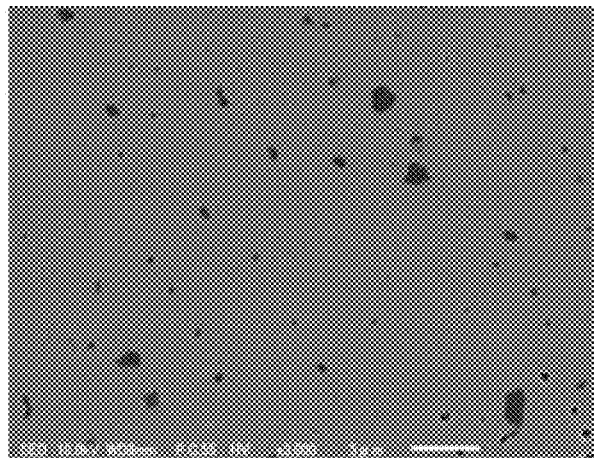
FIG. 5C is an SEM image showing a cross section of the sample A in Example.
Figure 6A:
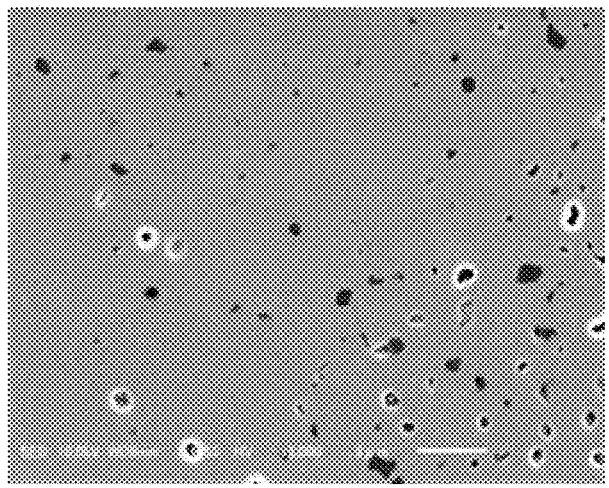
FIG. 6A is an SEM image showing a cross section of the sample A in Example.
Figure 6B:
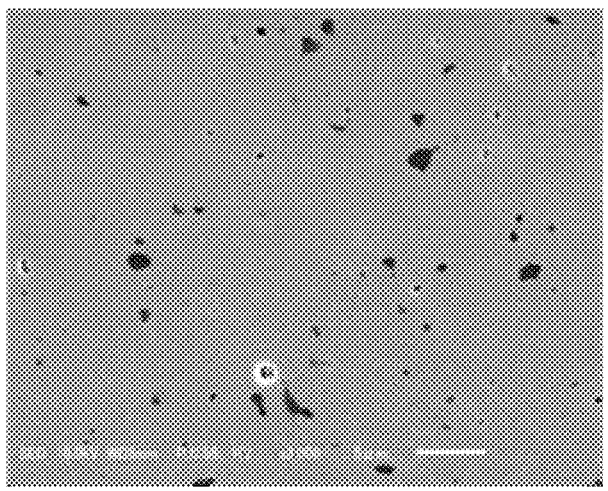
FIG. 6B is an SEM image showing a cross section of the sample A in Example.
Figure 6C:
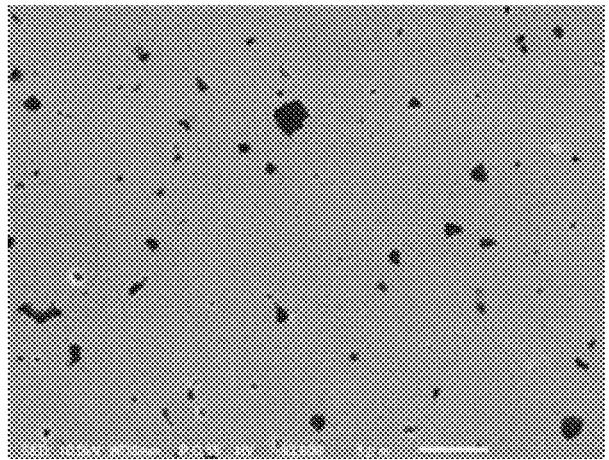
FIG. 6C is an SEM image showing a cross section of the sample A in Example.

In the SEM images of FIGS. 5A to 8C, black dots surrounded by white, such as those pointed by arrows in FIG. 5B, are pores. The white portions around the pores are caused by charge-up depending on the measurement conditions of the SEM. Black dots not surrounded by white are alumina mixed from an alumina container or ball of a planetary ball mill used for pulverizing the single crystal phosphor.

Table 2 below shows data related to pores of the sample A, the sample B and the sample C measured from the SEM images in FIGS. 5A to 8C and data related to pores of the sample D. "Average number of pores" in Table 2 is an average number of pores per image. "Average diameter", "Maximum diameter", "Minimum diameter" and a of "3σ" are respectively an average value, a maximum value, a minimum value and a standard deviation of the diameter of all pores included in the image. "Cross-sectional area ratio of pores" is a ratio of the area of the pores to the whole area in the image.

The area of the pores in the cross section can be obtained as an area of regions surrounded by the white portions caused by the charge-up in the SEM image (regions of actual openings). The ratio of the area of the pores to the whole area in the image can be obtained by, e.g., binarizing the SEM image using an image processing software and dividing the number of pixels in the pore area by the number of pixels in the whole area.

TABLE 2

| | Average number of pores | Pore diameter [μm] | | | | Cross-sectional area ratio of pores [%] |
| | | Average diameter | Maximum diameter | Minimum diameter | 3σ | |
|---|---|---|---|---|---|---|
| Sample A | 29 | 0.42 | 1.1 | 0.12 | 0.7 | 0.3 |
| Sample B | 31 | 0.32 | 0.8 | 0.13 | 0.5 | 0.2 |
| Sample C | 24 | 0.37 | 1.4 | 0.13 | 0.8 | 0.2 |
| Sample D | 62 | 0.54 | 1.7 | 0.17 | 0.8 | 1.0 |

Figure 9A:
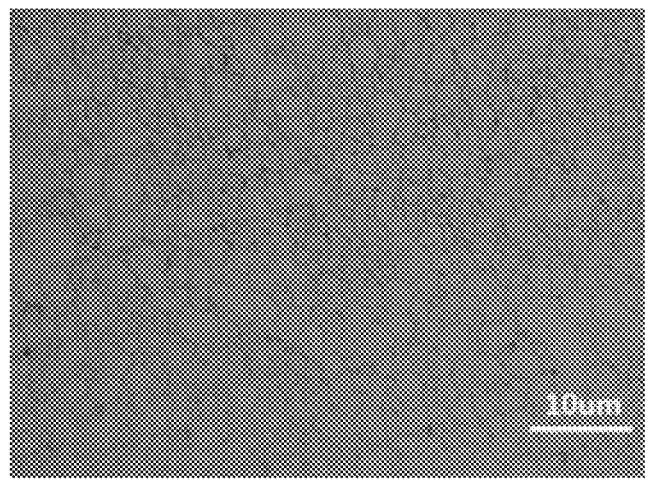
FIG. 9A is an optical microscopy image showing a surface of the sample B in Example.
Figure 9B:
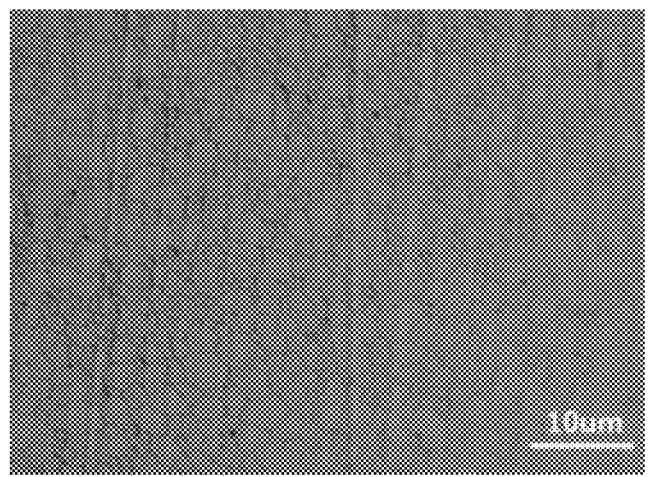
FIG. 9B is an optical microscopy image showing a surface of the sample C in Example.
Figure 9C:
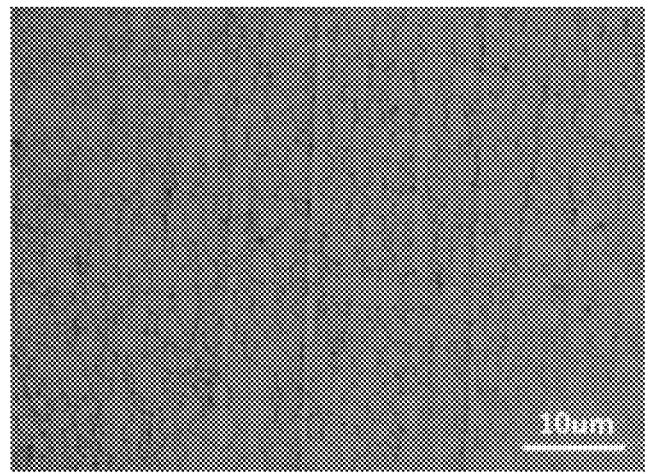
FIG. 9C is an optical microscopy image showing a surface of a sample D in Example.

FIGS. 9A, 9B and 9C are optical microscopy images respectively showing surfaces of the sample B, the sample C and the sample D. These observed surfaces of the samples were obtained by sequentially performing cutting of the samples by dicing, polishing of the cut surfaces, and thermal etching at 1450° C. for one hour.

Figure 10A:
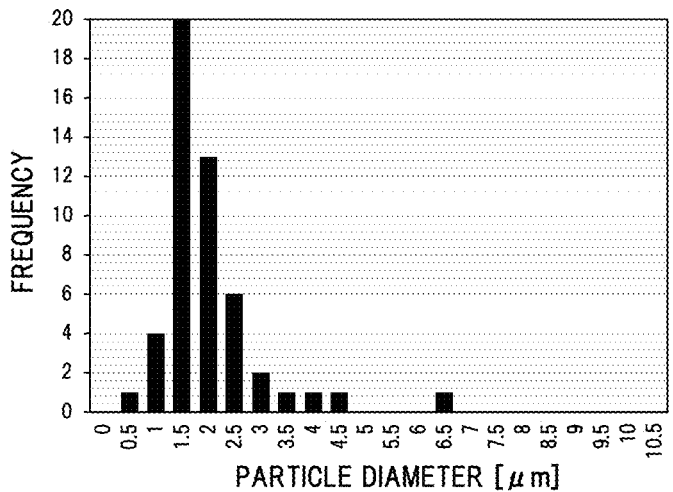
FIG. 10A is a graph showing grain diameter distribution in a single crystal phosphor of the sample B measured from the optical microscope image of FIG. 9A.
Figure 10B:
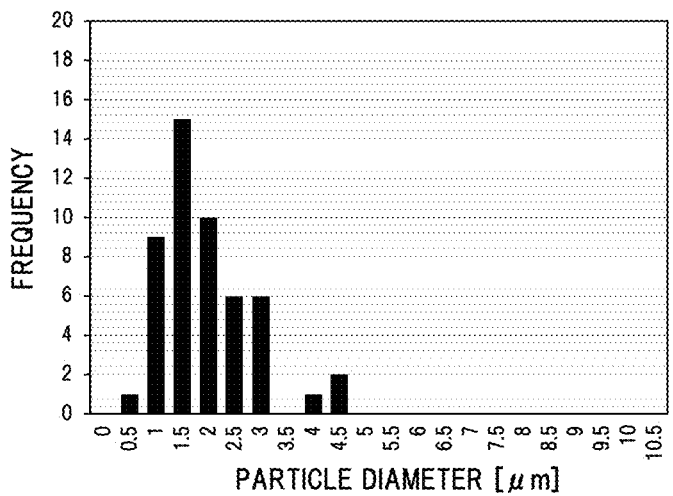
FIG. 10B is a graph showing grain diameter distribution in a single crystal phosphor of the sample C measured from the optical microscope image of FIG. 9B.
Figure 10C:
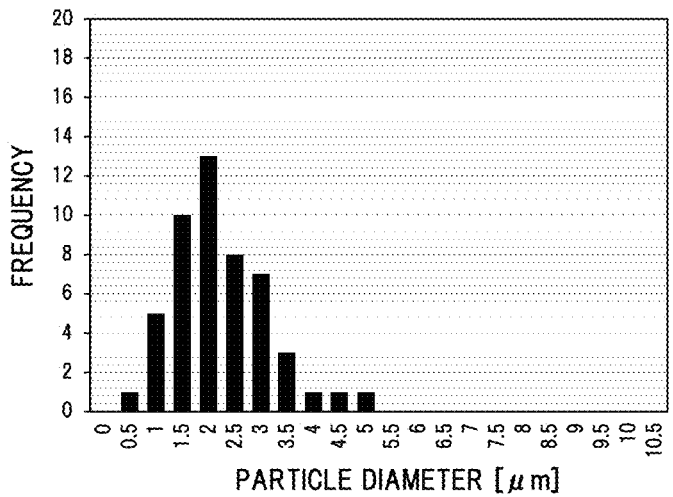
FIG. 10C is a graph showing grain diameter distribution in a single crystal phosphor of the sample D measured from the optical microscope image of FIG. 9C.
Figure 11:
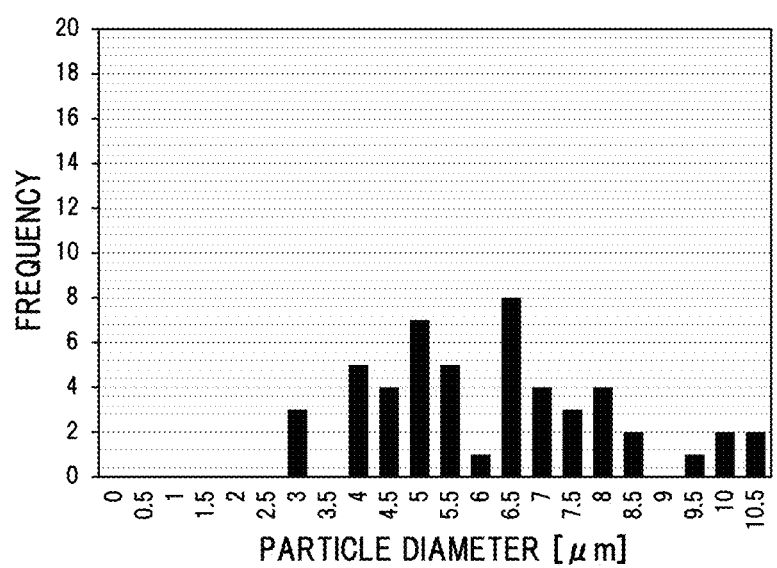
FIG. 11 is a graph showing grain diameter distribution in a phosphor of a wavelength conversion member in Comparative Example.

FIGS. 10A, 10B and 10C are graphs respectively showing grain diameter distributions in the single crystal phosphors of the sample B, the sample C and the sample D, which were measured from the surface optical microscope images of FIGS. 9A, 9B and 9C. FIG. 11 is a graph showing grain diameter distribution in a phosphor of a wavelength conversion member of Patent Literature 2 described above (Japanese Patent No. 5049336) as Comparative Example, which was measured from the microscopic image shown in FIG. 3 of Patent Document 2. These diameter distributions were obtained by drawing straight lines at arbitrary positions on the surface optical microscope images of FIGS. 9A, 9B and 9C and measuring diameters of 50 grains positioned on each straight line.

Table 3 below shows the diameters of the grains of the single crystal phosphors of the sample B, the sample C and the sample D which were measured from the surface optical microscope images of FIGS. 9A, 9B and 9C, and the diameter of the grains of the single crystal phosphor in Comparative Example which was measured from the microscopic image shown in FIG. 3 of Patent Literature 2. "Average diameter", "Maximum diameter", "Minimum diameter" and a of "3σ" in Table 3 are respectively an average value, a maximum value, a minimum value and a standard deviation of the diameter of all grains included in the image.

TABLE 3

| | Grain diameter [μm] | | | |
| | Average diameter | Maximum diameter | Minimum diameter | 3σ |
|---|---|---|---|---|
| Sample B | 1.7 | 6.2 | 0.4 | 3.0 |
| Sample C | 1.7 | 4.3 | 0.4 | 2.6 |
| Sample D | 2.0 | 5.1 | 0.3 | 2.8 |
| Comparative Example | 6.2 | 17.8 | 2.2 | 8.2 |

The present inventors conducted experiments and confirmed that the wavelength conversion member 1 formed of the sintered body of the single crystal phosphor and the wavelength conversion member 1 formed of the sintered body of the polycrystalline phosphor, in which the average diameter of the grains of the phosphor in an arbitrary cross section falls within the range of not less than 1 μm and not more than 3 μm, can be obtained by the manufacturing method in the embodiment described above, and expansion of the light extraction area on the light extraction surface is suppressed in these wavelength conversion members 1.

Table 4 below shows optical characteristics of the samples A to D at the room temperature, which were measured by a quantum efficiency measurement system (QE-2100 manufactured by Otsuka Electronics Co., Ltd.). Table 4 shows absorptance, internal quantum efficiency, external quantum efficiency and the chromaticity coordinates Cx and Cy at room temperature. The absorptance here can be calculated by dividing photons absorbed by the phosphor by photons of the excitation light. The external quantum efficiency is a value obtained by multiplying the absorptance by the internal quantum efficiency.

TABLE 4

| | Absorptance | Internal quantum efficiency | External quantum efficiency | Cx | Cy |
|---|---|---|---|---|---|
| Sample A | 0.81 | 0.97 | 0.79 | 0.428 | 0.553 |
| Sample B | 0.79 | 0.99 | 0.78 | 0.429 | 0.552 |
| Sample C | 0.83 | 0.97 | 0.80 | 0.429 | 0.553 |
| Sample D | 0.81 | 1.00 | 0.81 | 0.428 | 0.552 |

Table 5 below shows optical characteristics of the samples A to D under high temperature condition, which were measured by a quantum efficiency measurement system (QE-2100 manufactured by Otsuka Electronics Co., Ltd.). "Absorptance" in Table 5 is absorptance at 300° C., "Internal quantum efficiency" is a value of a ratio of internal quantum efficiency at 300° C. to internal quantum efficiency at 25° C., "External quantum efficiency" is a value obtained by multiplying "Absorptance" by "Internal quantum efficiency" in Table 5, and "Cx" and "Cy" are respectively Cx and Cy of the chromaticity coordinates at 300° C.

TABLE 5

|  | Absorptance | Internal quantum efficiency | External quantum efficiency | Cx | Cy |
| --- | --- | --- | --- | --- | --- |
| Sample A | 0.80 | 0.94 | 0.76 | 0.455 | 0.530 |
| Sample B | 0.79 | 0.94 | 0.74 | 0.454 | 0.531 |
| Sample C | 0.82 | 0.98 | 0.80 | 0.456 | 0.530 |
| Sample D | 0.80 | 0.95 | 0.76 | 0.452 | 0.532 |

The measurement of the internal quantum efficiency was performed on the samples A to D processed into a plate shape with a length of 10 mm, a width of 10 mm and a thickness of 0.3 mm and not having a reflective film, a planarization film and a protective film, etc. Meanwhile, in the calculation of the internal quantum efficiency, the count range of the number of photons of the excitation light was 440-470 nm, and the count range of the number of photons of fluorescence was 480-780 nm.

Example 2

The wavelength conversion members 1 in the first embodiment and wavelength conversion members in Comparative Example were made and various evaluations were conducted. These wavelength conversion members are sintered bodies of a single crystal phosphor having a composition represented by a composition formula $(Y_{0.998}Ce_{0.002})_3Al_5O_{12}$.

Figure 12:
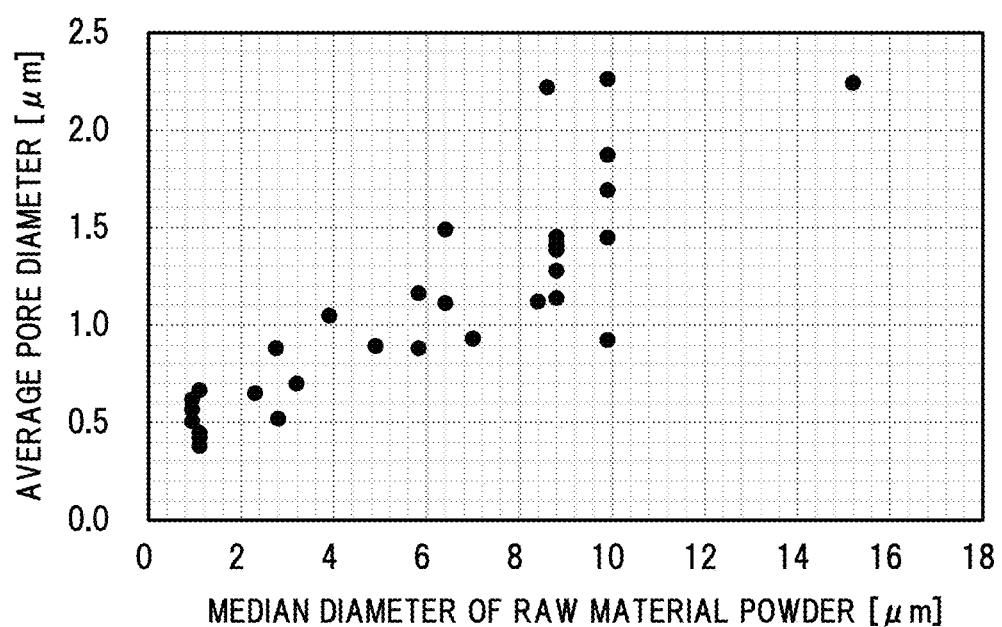
FIG. 12 is a graph showing a relationship between a median diameter of raw material powder and an average diameter of pores in a cross section of the wavelength conversion member.

FIG. 12 is a graph showing a relationship between the median diameter of the raw material powder and the average diameter of the pores in a cross section of the wavelength conversion member. Among the plotted data points in the graph of FIG. 12, data points within the average pore diameter range of not less than 0.28 μm and not more than 0.98 μm are values of those corresponding to the wavelength conversion member 1 in the first embodiment.

Table 6 below shows the median diameter of the raw material powder and the average diameter of the pores of seven samples corresponding to the wavelength conversion member 1 in the first embodiment among the samples in the graph of FIG. 12.

TABLE 6

| Median diameter of Raw material powder [μm] | Average diameter of pores [μm] |
| --- | --- |
| 1.1 | 0.38 |
| 1.1 | 0.42 |
| 1.1 | 0.45 |
| 1.1 | 0.67 |
| 0.9 | 0.51 |
| 0.9 | 0.57 |
| 0.9 | 0.62 |

FIG. 12 shows that there is a tendency that the larger the particle diameter of raw material powder, the larger the diameter of the pores of the wavelength conversion member which is the sintered body of such raw material powder. This indicates that the diameter of the pores of the wavelength conversion member can be controlled by the particle diameter of the raw material powder. It was also confirmed that variation in the average diameter of the pores is reduced with a decrease in the particle diameter of raw material powder.

In addition, according to FIG. 12, the average diameters of the pores of the wavelength conversion members obtained by sintering the raw material powders with a particle diameter of about 1 μm fall within the range of not less than 0.38 μm and not more than 0.67 μm. These wavelength conversion members correspond to the wavelength conversion member 1 in the first embodiment.

Figure 13:
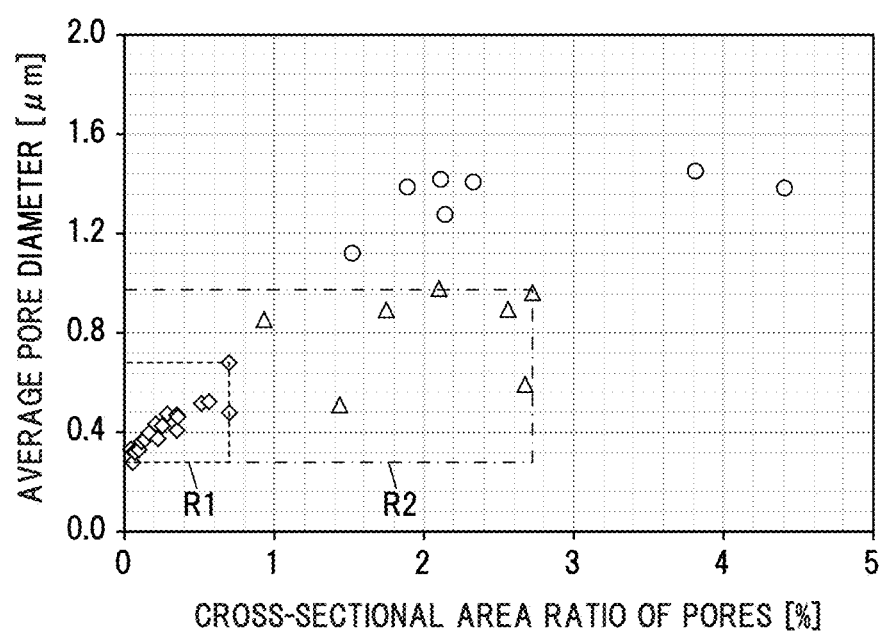
FIG. 13 is a graph showing a relationship between the average diameter and a cross-sectional area ratio of the pores for the wavelength conversion members formed of raw material powders with different particle diameters.

FIG. 13 is a graph showing a relationship between the average diameter of the pores and the cross-sectional area ratio (a ratio of the area of pores to the whole area in a cross section of the wavelength conversion member) for each of the wavelength conversion members formed of raw material powders with different particle diameters. These wavelength conversion members are sintered bodies of a single crystal phosphor having a composition represented by a composition formula $(Y_{0.998}Ce_{0.002})_3Al_5O_{12}$.

In FIG. 13, plot marks "◇" are measured values of samples formed of raw material powders with the median diameter of not more than 1.5 μm, plot marks "Δ" are measured values of samples formed of raw material powders with the median diameter of more than 1.5 μm and not more than 5 μm, and plot marks "○" are measured values of samples formed of raw material powders with the median diameter of more than 5 μm.

According to FIG. 13, the range of the cross-sectional area ratio corresponding to the particle diameter range of not less than 0.28 μm and not more than 0.98 μm, which is equivalent to the particle diameter of the raw material powder of the wavelength conversion member 1 in the first embodiment, is about not less than 0.04% and not more than 2.7% (a region R2). Meanwhile, the range of the cross-sectional area ratio corresponding to the particle diameter range of not less than 0.28 μm and not more than 0.68 μm, which is equivalent to the preferable particle diameter of the raw material powder of the wavelength conversion member 1 in the first embodiment, is about not less than 0.04% and not more than 0.7% (a region R1).

Note that, the data points of FIG. 12 do not correspond one-to-one with the data points of FIG. 13. This is because not all the samples were subjected to data measurement.

Figure 14:
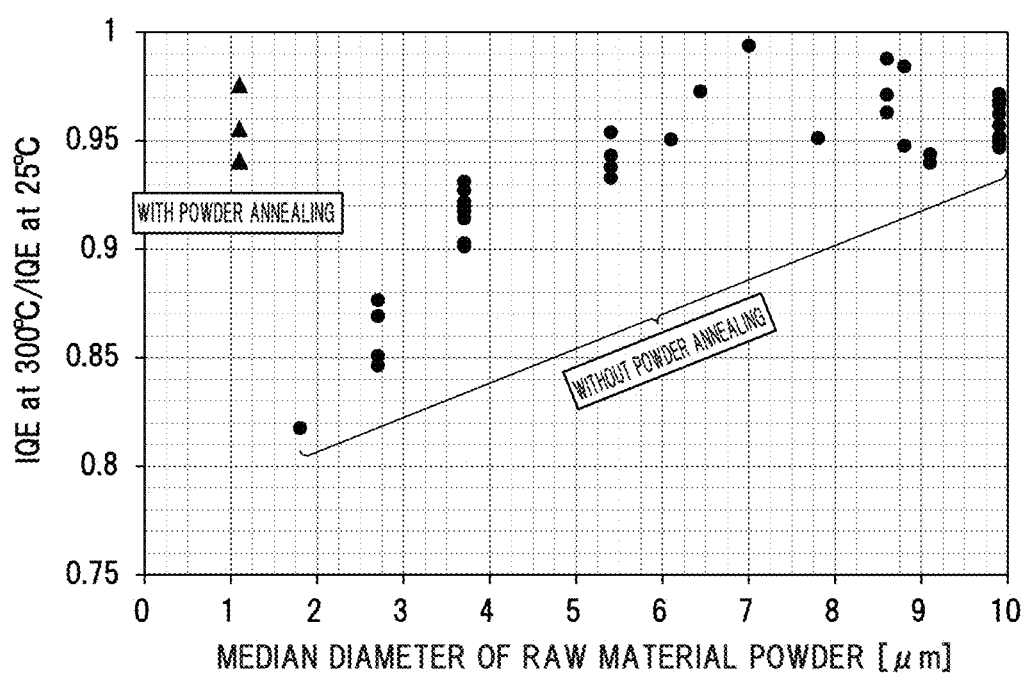
FIG. 14 is a graph showing a relationship between the median diameter of the raw material powder and a value of a ratio of internal quantum efficiency of the wavelength conversion member at 300° C. to internal quantum efficiency at 25° C.

FIG. 14 is a graph showing a relationship between the median diameter of the raw material powder and a value of the ratio of internal quantum efficiency of the wavelength conversion member at 300° C. to internal quantum efficiency at 25° C. QE-2100 manufactured by Otsuka Electronics Co., Ltd. was used for measurement of the internal quantum efficiency.

FIG. 14 shows measured values of the wavelength conversion members which were powder-annealed in Step S3 in the manufacturing process of the first embodiment (corresponding to the wavelength conversion member 1 in the first embodiment) and the wavelength conversion members which were not powder-annealed. These wavelength conversion members are sintered bodies of a single crystal phosphor having a composition represented by a composition formula $(Y_{0.998}Ce_{0.002})_3Al_5O_{12}$.

According to FIG. 14, in the wavelength conversion members which were not powder-annealed, the internal quantum efficiency at 300° C. decreases as the particle diameter of the raw material powder decreases. On the other hand, in the wavelength conversion members which were powder-annealed, the value of the ratio of internal quantum efficiency at 300° C. to internal quantum efficiency at 25° C. is very high and is within the range of not less than 0.93 and not more than 0.98 even though the particle diameter of the raw material powder is as very small as about 1 μm.

Table 7 below shows the median diameter of the raw material powder and the value of the ratio of internal quantum efficiency at 300° C. to internal quantum efficiency at 25° C. (IQE at 300° C./IQE at 25° C.) of three powder-annealed samples corresponding to the wavelength conversion member 1 in the first embodiment among the samples in the graph of FIG. 14.

TABLE 7

| Median diameter of Raw material powder [μm] | IQE at 300° C./ IQE at 25° C. |
|---|---|
| 1.1 | 0.94 |
| 1.1 | 0.96 |
| 1.1 | 0.98 |

According to FIG. 14, a decrease in the internal quantum efficiency caused by the particle diameter of the raw material powder which is small due to crushing is observed when the median diameter of the raw material powder is about not more than 5 μm. However, even when the median diameter of the raw material powder is about not more than 5 μm, the value of the ratio of internal quantum efficiency at 300° C. to internal quantum efficiency at 25° C. can be increased to the range of not less than 0.93 and not more than 0.98 by performing the power annealing. In addition, by performing the power annealing, quantum efficiency comparable to when using the raw material powder with a median diameter of more than 5 μm can be obtained, and the value of the ratio of internal quantum efficiency at 300° C. to internal quantum efficiency at 25° C. can be increased to 0.98 or more, even to substantially 1.0.

Figure 15A:
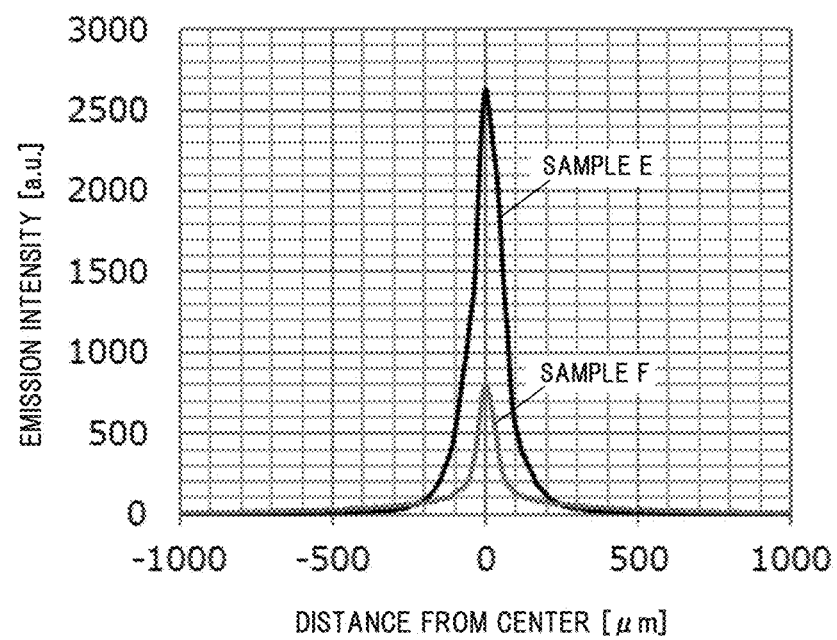
FIG. 15A is a graph showing a light emission profile of a wavelength conversion member obtained by sintering raw material powder with a median diameter of 1.1 μm and that of a wavelength conversion member obtained by sintering raw material powder with a median diameter of 5.1 μm.

FIG. 15A is a graph showing a light emission profile of a wavelength conversion member which corresponds to the wavelength conversion member 1 in the first embodiment and is obtained by sintering the powder-annealed raw material powder with a median diameter of 1.1 μm (a sample E), and a light emission profile of a wavelength conversion member in Comparative Example obtained by sintering the non-powder-annealed raw material powder with a median diameter of 5.1 μm (a sample F). The horizontal axis of FIG. 15A is a distance from the centers of the plate-shaped samples E and F. In this measurement, a blue laser light with a wavelength of 450 nm was shone onto the wavelength conversion members with a spot size (full width at half maximum) of 0.1 mm and emission intensity of fluorescence therefrom was measured from the front of the wavelength conversion members.

The samples E and F are sintered bodies of a single crystal phosphor having a composition represented by a composition formula $(Y_{0.998}Ce_{0.002})_3Al_5O_{12}$. The pores of the sample E have an average diameter of 0.4 μm and a cross-sectional area ratio of 0.3%, and the pores of sample F has an average diameter of 1.0 μm and a cross-sectional area ratio of 4.9%.

Regarding the light distribution (a profile of light intensity with respect to the light emission angle), both samples E and F have a Lambertian light distribution (not shown), but the sample E exhibits smaller spreading of light at the emission area and higher emission intensity in the luminescence center, as compared to the sample F.

FIG. 15A shows that the emission intensity at the center of the sample E is about 3.3 times the emission intensity at the center of the sample F. It is considered that this is because the spreading of light inside the sample E is suppressed by the pore diameter, the cross-sectional area ratio of the pores and the diameter of the grains of the phosphor of the sample E, and the internal quantum efficiency was also increased by powder annealing.

Figure 15B:
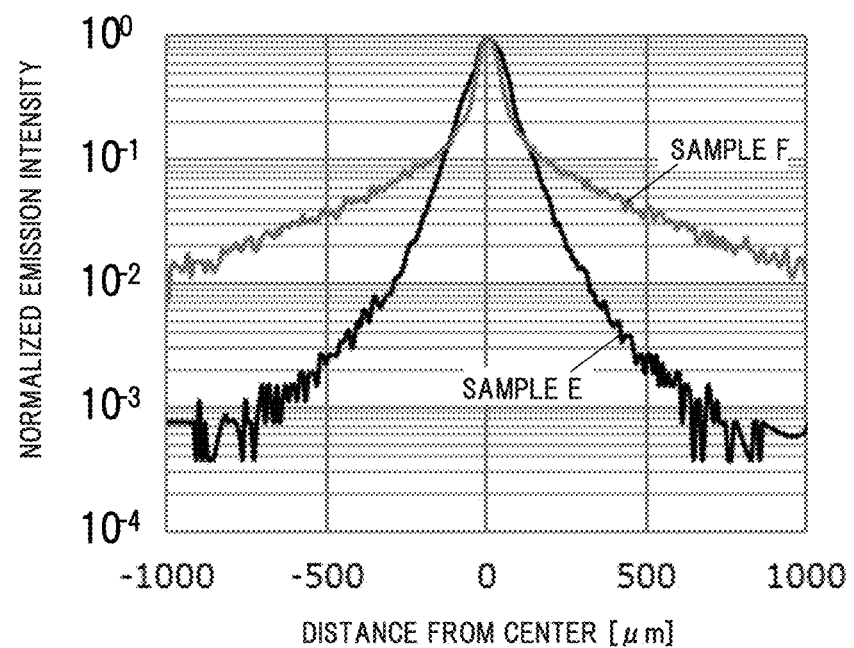
FIG. 15B is a graph showing light emission profiles of samples E and F obtained by respectively normalizing emission intensities of the samples E and F so that peak intensity is 1.

FIG. 15B is a graph showing light emission profiles of the samples E and F obtained by respectively normalizing emission intensities of the samples E and F so that peak intensity is 1.

FIG. 15B shows that the spreading of light extracted from the sample E is suppressed as compared to the sample F.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples described above. Further, it should be noted that not all combinations of the features described in the embodiments and Examples are necessary to solve the problem of the invention.

INDUSTRIAL APPLICABILITY

The wavelength conversion member in which expansion of a light extraction area on a light extraction surface is suppressed can be used for semiconductor light-emitting devices, etc.

REFERENCE SIGNS LIST

1 WAVELENGTH CONVERSION MEMBER
10 WAVELENGTH CONVERSION ELEMENT

The invention claimed is:
1. A wavelength conversion member, comprising a sintered body of a phosphor,
   wherein an average diameter of pores in an arbitrary cross section falls within a range of not less than 0.28 μm and not more than 0.98 μm,
   wherein a ratio of an area of pores to a whole area in an arbitrary cross section falls within a range of not less than 0.04% and not more than 2.7%,
   wherein an average diameter of grains of the phosphor in an arbitrary cross section falls within a range of not less than 1 μm and not more than 3 μm; and
   wherein the phosphor has a composition represented by a composition formula $(Y_{1-x-y-z}Lu_xGd_yCe_z)_{3+a}Al_{5-a}O_{12}$ ($0 \leq x \leq 0.9994$, $0 \leq y \leq 0.0669$, $0.0002 \leq z \leq 0.0067$, $-0.016 \leq a \leq 0.315$).

2. The wavelength conversion member according to claim 1, wherein the average diameter of pores in an arbitrary cross section falls within a range of not less than 0.28 μm and not more than 0.68 μm, and wherein the ratio of the area of pores to the whole area in an arbitrary cross section falls within a range of not less than 0.04% and not more than 0.7%.

3. The wavelength conversion member according to claim 1, wherein each of the grains of the phosphor comprises a single crystal.

4. The wavelength conversion member according to claim 1, wherein each of the grains of the phosphor comprises a single crystal, and wherein a value of a ratio of internal quantum efficiency at 300° C. to internal quantum efficiency at 25° C. when a peak wavelength of excitation light is 450 nm is not less than 0.93.

5. The wavelength conversion member according to claim 2, wherein each of the grains of the phosphor comprises a single crystal.

* * * * *